(12) United States Patent
Lin et al.

(10) Patent No.: US 6,235,608 B1
(45) Date of Patent: May 22, 2001

(54) STI PROCESS BY METHOD OF IN-SITU MULTILAYER DIELECTRIC DEPOSITION

(75) Inventors: Chi-Fa Lin; Wei-Tsu Tseng; Min-Shinn Feng, all of Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/292,772

(22) Filed: Apr. 14, 1999

(51) Int. Cl.$^7$ ............... H01L 21/336; H01L 21/461; H01L 21/31; H01L 21/469

(52) U.S. Cl. ............ 438/424; 438/296; 438/692; 438/791; 438/970

(58) Field of Search .................. 438/424, 218, 438/221, 296, 692, 693, 702, 791, 970

(56) References Cited

U.S. PATENT DOCUMENTS 5,960,297 * 9/1999 Saki .
5,968,842 * 10/1999 Hsiao .
6,060,370 * 5/2000 Hsia et al. .

* cited by examiner

Primary Examiner—John F. Niebling
Assistant Examiner—Ron Pompey
(74) Attorney, Agent, or Firm—W. Wayne Liauh

(57) ABSTRACT

A process for forming shallow trench isolation (STI) structures. It includes the steps of: (a) depositing a composite silicon nitride on to the silicon substrate; (b) forming a shallow trench on the silicon substrate by etching, using the composite silicon nitride as the hard mask; (c) depositing a filler oxide layer inside the shallow trench as well as on top of the composite silicon nitride, using a chemical vapor deposition (CVD) method; and (d) using a chemical-mechanical polishing (CMP) process to planarize the filler oxide layer using the composite nitride as a CMP stop. The composite silicon nitride comprises a plurality of silicon nitride layers whose CMP removal rate increases with the distance from the silicon substrate. Additionally, a composite silicon oxide layer can be formed on top of the filler oxide layer which comprises a plurality of silicon oxide layers whose CMP removal rate increases with the distance from the silicon substrate.

12 Claims, 2 Drawing Sheets

STI PROCESS BY METHOD OF IN-SITU MULTILAYER DIELECTRIC DEPOSITION

FIELD OF THE INVENTION

The present invention relates to an improved method for the fabrication of shallow trench isolation (STI) structures, or the so-called STI process, using the chemical-mechanical polishing (CMP) technique. More specifically, the present invention relates to an improved process for the CMP planarization of semiconductor devices containing shallow trench isolations which utilizes silicon nitride ($SiN_x$) as the CMP/etching step. The method disclosed in the present invention provides excellent global planarity for shallow trench isolations; it also eliminates, or at least minimizes, dishing effect in the trenches and other portions of the dielectric during the CMP process. The present invention is most advantageous for use in advanced ultra-large-scale integration (ULSI) shallow trench isolation processes, such as the fabrication of shallow trench insulation structures in 0.25 $\mu$m memory devices or beyond.

BACKGROUND OF THE INVENTION

A semiconductor typically contains a plurality of pockets of semiconductor material in which one or more circuit elements are formed. Conventionally, these semiconductor pockets are isolated by the LOCOS (Local Oxidation of Silicon) technique. However, the LOCOS technique has some disadvantages, especially in the fabrication of deep sub-micron very-high-density devices such as high density memory cells, because it can result in an undesirable isolation encroachment into the active device area, commonly known as "bird's beak". The LOCOS method also produces a non-planar surface when silicon oxide is grown on the surface of silicon, the thickness of the oxide which grows is typically twice the thickness of the silicon prior to oxidation.

Shallow trench isolation (STI) technique has been developed which offers several significant improvements over some aspects of the LOCOS process, especially in the fabrications of high density CMOS (complementary metal oxide semiconductor) circuits. In general, the STI process includes the steps of first etching a shallow trench (typically 0.5 $\mu$m or less), then growing a thin oxide immediately after etch. Then the trench is filled with a dielectric by deposition of oxide, which also forms a top oxide layer above the substrate. The dielectric can be "densified," either by oxidizing the dielectric or using a high-temperature anneal in an inert ambient. Finally, the top oxide layer is planarized, typically by a chemical-mechanical polishing (CMP) process, using the top oxide layer as a sacrificial layer. Prior to the etching process, a silicon nitride layer ($SiN_x$) is typically formed with the assistance of a photoresist. Due to its lower removal rate relative to the top oxide layer, the nitride layer serves as a CMP stop; it also serves as a hard mask during the etching process to form the trenches in the substrate. To protect the active regions from nitridation and achieve better process control, a thin pad oxide is typically thermally grown or deposited on the substrate surface prior to the deposition of the silicon nitride layer, and an oxide liner with good film quality can also be deposited on the surface of the trenches.

With the dimension of the trenches becoming smaller and the density of the semiconductor devices getting higher, several inadequacies are observed with the conventional shallow trench isolation process. Most notably, the oxide-filled trenches are often found to be subject to the so-called dishing effect during the CMP process. There are also problems associated with nitride residues that are found on the dished trench surface as well as on the top of active regions of the substrate, or oxide that remains on the nitride stoppers.

U.S. Pat. No. 5,741,740 discloses a method for filling a trench within a silicon substrate by first forming a trench in a silicon substrate, followed by thermally oxidizing the silicon substrate to form within the trench a thermal silicon oxide trench liner layer. A conformal silicon oxide intermediate layer is then formed upon the thermal silicon oxide trench liner through a plasma enhanced chemical vapor deposition (PECVD) employing a silane silicon source material. Finally, a gap filling silicon oxide trench fill layer is formed upon the conformal silicon oxide intermediate layer through an ozone assisted sub-atmospheric pressure thermal chemical vapor deposition (SACVD) method employing an ozone oxidant and a tetra-ethyl-ortho-silicate (TEOS).

U.S. Pat. No. 5,643,822 discloses a method for improving the sub-threshold leakage of a trench-isolated FET device which involves the steps of first forming a vertical slot within a stack structure disposed on an oxide-covered silicon substrate, then forming spacers on the sidewalls of the slot. A trench is then etched in the substrate. A horizontal ledge on the exposed surfaces of the oxide-covered substrate adjacent the trench is uncovered after the removal of the spacers. The ledge is then perpendicularly implanted with a dopant to suppress edge conduction in the device.

U.S. Pat. No. 5,332,467 discloses a method of planarizing a wafer surface by using a polish step with chemical/mechanical polishing which involves first forming a first layer over a rugged surface of a semiconductor wafer with broad indentations. A hard film layer is formed over the first layer, whereby the first layer and the hard film layer are patterned to form polishing stop islands in the broad indentations. A second layer is then formed over the rugged surface and the polishing stop islands to create a top surface for polishing, the hard film layer being harder than both the top surface and the rugged surface. The top surface is polished in a vertical direction to remove portions of the top surface, until the top surface is co-planar with the top of the polishing stop islands, and finally the remainder of the hard film layer is removed to complete the planar surface.

U.S. Pat. No. 5,643,823 discloses the use of a thin crystalline layer of silicon nitride ($Si_3N_4$) in shallow trench isolation structures as an $O_2$ barrier film. It is reported that the crystalline $Si_3N_4$ lowers the density of electron traps as compared to the as-deposited amorphous $Si_3N_4$. The process of forming the crystalline $Si_3N_4$ film in a shallow trench isolation (STI) structure comprises the steps of (1) depositing by low-pressure chemical-vapor deposition (LPCVD) a $Si_3N_4$ film 5 to 10 nm thick within the STI structure at a temperature between 720 and 780° C., and (2) immediately after the deposition of the $Si_3N_4$ film, conducting a rapid-terminal anneal between 1,050 and 1,150° C. for 60 seconds to convert the $Si_3N_4$ film from an amorphous state to a crystalline state.

All the above mentioned inventions provide certain useful improvement in the formation of shallow trench isolation structures. However, none of them addressed the issue of how to eliminate or at least minimize the dishing problem during the CMP step in a relatively simple and cost-effective manner. In light of the growing importance of the STI structures and the planarization thereof, it is important to devote research and development effort for the improvement of the STI process.

SUMMARY OF THE INVENTION

The primary object of the present invention is to develop a method to effectuate an improved CMP planarization of shallow trench isolation (STI) structures. More specifically, the primary object of the present invention is to develop an improved STI process that will eliminate, or at least minimize, the dishing effect often encountered during the CMP planarization of the STI structure without incurring substantially increased process complexity nor manufacturing cost. The method disclosed in the present invention is also effective in eliminating the nitride and oxide residue problems experienced with the conventional STI process utilizing CMP planarization.

In the method disclosed in the present invention, instead of employing a CMP stopper having a uniform property as in all prior processes, a composite silicon nitride ($SiN_x$) is used which exhibits a gradient of CMP removal rate that increases with distance from the silicon substrate in a step-wise manner. More significantly, the inventors discovered that the CMP removal rate of the silicon nitride can be adjusted by adjusting the ratio between $SiH_4$ and $NH_3$ or $N_2$ gas in the PECVD (plasma-enhanced chemical-vapor deposition) chamber. By increasing the proportion of the $NH_3$ or $N_2$ gas from its initial value, a composite silicon nitride layer can be deposited on the silicon surface which provides a gradient CMP removal rate that increases with distance from the silicon substrate.

The present invention can be summarized as comprising the following steps:

(a) Placing a silicon substrate in which shallow trench isolation structure is to be formed inside a PECVD (plasma-enhanced chemical-vapor deposition) chamber, which contains a silicon containing component and a nitrogen containing component at a first silicon/nitrogen ratio, wherein the silicon containing component is $SiH_4$ or tetra-ethyl-ortho-silicate (TEOS), and the nitrogen containing gas is $NH_3$ or $N_2$;

(b) Depositing a first layer of silicon nitride on to the silicon substrate at a first silicon/nitrogen ratio;

(c) Reducing the silicon/nitrogen ratio in the PECVD chamber and depositing anther layer of silicon nitride the reduced silicon/nitrogen ratio;

(d) Repeating Step (c), if so desired, to deposit one or more silicon nitride layers at further reduced silicon/nitrogen ratio;

(e) Forming shallow trenches on the silicon substrate by etching using the silicon nitride layers as a hard mask;

(f) Depositing a filler oxide layer inside the shallow trenches and on top of the silicon nitride layers; and (g) Using a chemical-mechanical polishing (CMP) process to planarize the filler oxide layer using the nitride layers as a CMP stop.

The composite silicon nitride layer, which comprises the multiplicity of silicon nitride layers deposited at stepwisely reducing silicon/nitrogen ratios, has the highest CMP removal rate at the top, and the CMP removal rate decreases as it approaches the silicon substrate. Such a gradient CMP removal rate composite silicon nitride layer greatly improves the global planarization of the shallow trench isolation structure.

The process of the present invention can be further improved by depositing, also using PECVD, a composite TEOS oxide layer, which comprises a plurality of TEOS oxide layers with upwardly increasing CMP removal rate, on top of the filler oxide layer. The composite TEOS oxide layer can be formed by depositing TEOS oxide layers according to a series of step-wisely reducing silicon/oxygen ratios. Typically the silicon component is $SiH_4$ or TEOS, and the oxygen component is $N_2O$ or $O_2$ gas. Preferably the composite silicon nitride layer and the composite silicon oxide layer are so formed that the CMP removal rate of at least one of the nitride layers in the composite silicon nitride layer is no greater than 20% lower than at least one of the silicon oxide layer in said composite silicon oxide layer.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
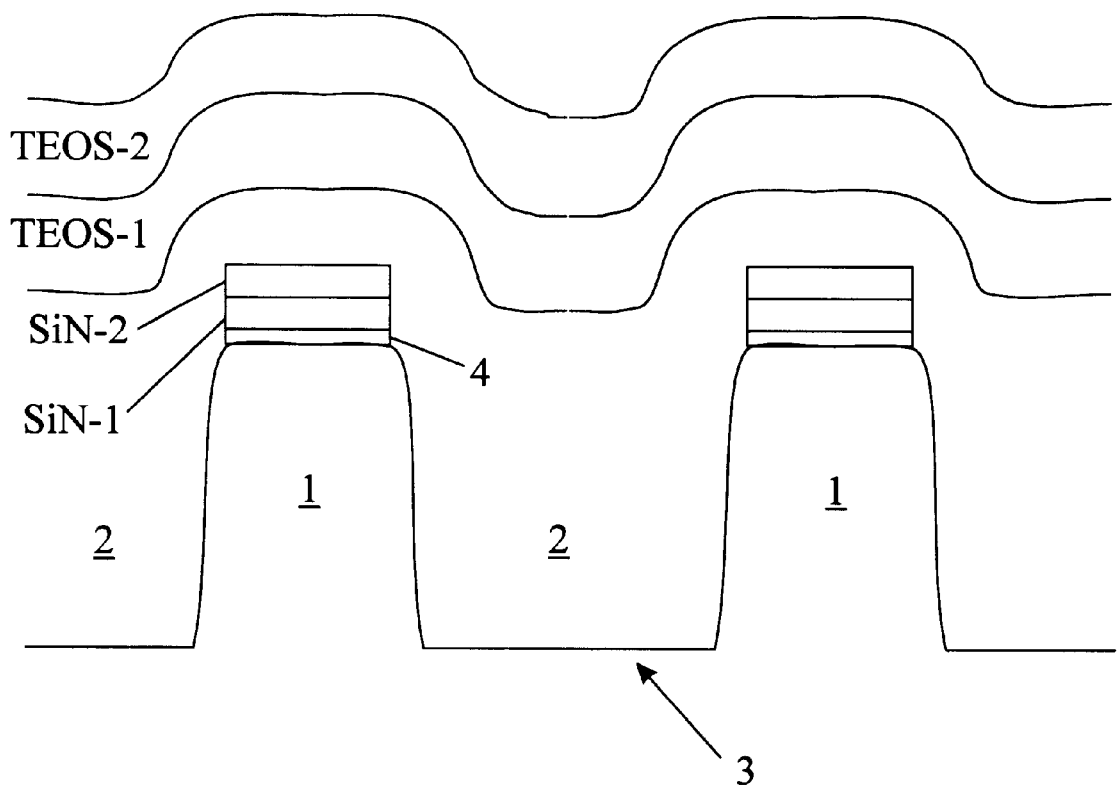
FIG. 1 is a schematic side view of a shallow trench isolation structure of the present invention before the CMP planarization process which contains a two-layered composite nitride layer and a two-layered composite filler oxide layer.

The present invention discloses a method to improve the CMP planarization of shallow trench isolation (STI) structures, as a part of so-called STI process. The improved STI process of the present invention eliminates or at least minimizes the dishing effect often encountered during the CMP planarization of the STI strurecture; it also eliminates the nitride and oxide residue problems experienced with the conventional STI process utilizing CMP planarization. One of the main advantages of the improved STI process of the present invention is that significant benefits can be achieved without the need to substantially increase the process complexity, nor does it incur substantially increased manufacturing cost.

In the method disclosed in the present invention, instead of the conventional approach of employing a CMP stop with a uniform property, a composite silicon nitride ($SiN_x$) is used which exhibits a gradient of CMP removal rate which increases with distance from the silicon substrate. The method of the present invention is greatly simplified by adjusting the ratio between $SiH_4$ (or TEOS) and $NH_3$ (or $N_2$) gas in the PECVD (plasma-enhanced chemical-vapor deposition) chamber. By increasing the proportion of the $NH_3$ or $N_2$ gas from its initial value, a composite silicon nitride can be deposited on the silicon surface which provides a gradient CMP removal rate that increases with distance from the silicon substrate.

The present invention can be summarized as comprising the following steps:

(a) placing a silicon substrate, in which a shallow trench isolation structure is to be formed, inside a PECVD (plasma-enhanced chemical-vapor deposition) chamber;

(b) depositing a composite silicon nitride on to the silicon substrate;

(c) forming a shallow trench on the silicon substrate by etching, using the composite silicon nitride as the hard mask;

(d) depositing a filler oxide layer inside the shallow trench as well as on top of the composite silicon nitride, using a chemical vapor deposition (CVD) method; and (e) using a chemical-mechanical polishing (CMP) process to planarize the filler oxide layer using the composite nitride as a CMP stop;

(f) wherein the composite silicon nitride comprises a plurality of silicon nitride layers whose CMP removal rate increases with the distance from the silicon substrate.

In the present invention, the composite silicon nitride is formed by the following steps:

(b-1) using a plasma-enhanced chemical-vaporization deposition (PECVD) process to deposit a silicon nitride on to the silicon substrate in the PECVD chamber, which contains a silicon containing component and a nitrogen containing component at the a silicon/nitrogen ratio, preferably, the silicon-containing component is $SiH_4$ or TEOS and the nitrogen-containing component is $NH_3$ or $N_2$;

(b-2) reducing the silicon/nitrogen ratio in the PECVD chamber and depositing anther layer of silicon nitride the reduced silicon/nitrogen ratio; and (b-3) repeating Step (b)-2, if so desired, to deposit one or more silicon nitride layers at further reduced silicon/nitrogen ratio.

In Steps (b-1) through (b-3), the plurality of nitride layers are deposited in conjunction with the same photoresist. A thin pad oxide layer can be formed, typically by thermal oxidation, prior to the deposition of the silicon nitride layers. Also a thin oxide liner can be formed, also by thermal oxidation, The composite silicon nitride layer, which comprises the multiplicity of silicon nitride layers deposited at reducing silicon/nitrogen ratios, has the highest CMP removal rate at the top, and the CMP removal rate decreases as it approaches the silicon substrate. Such a gradient composite silicon nitride layer structure greatly improves the global planarization of the shallow trench isolation structures.

In another preferred embodiment, the process of the present invention is further improved by depositing, using PECVD, a composite TEOS oxide layer, which comprises a plurality of TEOS oxide layers with upwardly increasing CMP removal rate, on top of the filler oxide layer. The composite TEOS oxide layer can be formed by depositing TEOS oxide layers according to a series of step-wisely reducing silicon/oxygen ratios. Typically the silicon component is $SiH_4$ or TEOS, and the oxygen component is $N_2O$ or $O_2$ gas.

FIG. 1 is a schematic side view of a shallow trench isolation structure of the present invention prior to the CMP planarization. The shallow trench isolation structure is shown to have a composite nitride layer, which contains two silicon nitride layers, SiN-1 and SiN-2, and a composite TEOS layer, which also contains two TEOS layers, TEOS-1 and TEOS-2. SiN-1 has a lower CMP removal rate that SiN-2, and, likewise, TEOS-1 has a lower CMP removal rate than TEOS-2. In this representation, the two silicon nitride layers, SiN-1 and SiN-2, constitute the composite nitride layer, and the two TEOS layers, TEOS-1 and TEOS-2 constitute the composite filler oxide layer. FIG. 1 also shows a shallow trench 2 sandwiched between two active regions 1, both are positioned above the silicon substrate 3. FIG. 1 also shows a pad oxide layer between the SiN-1 layer and the active region 2.

Figure 2:
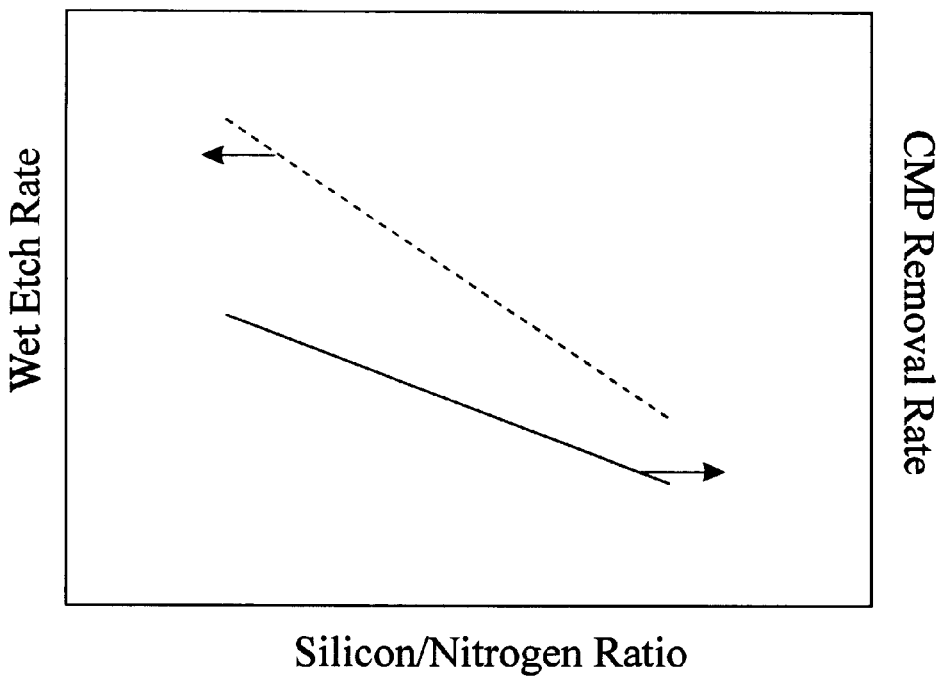
FIG. 2 show plots of CMP removal rate and wet etch rate, respectively, of silicon nitride vs the silicon/nitrogen ratio of the PECVD (plasma-enhanced chemical-vapor deposition) chamber in which the silicon nitride is deposited on a silicon substrate.
Figure 3:
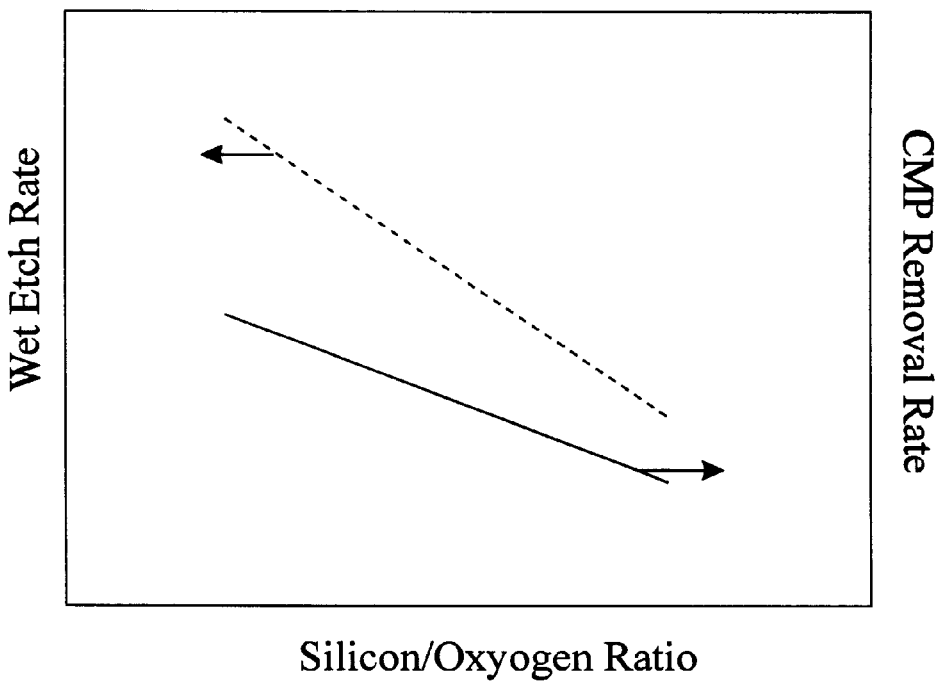
FIG. 3 show plots of CMP removal rate and wet etch rate, respectively, of silicon oxide vs silicon/oxygen ratio of the PECVD chamber in which the silicon oxide is deposited on a silicon substrate.

FIG. 2 shows plots of CMP removal rate and wet etch rate, respectively, of silicon nitride vs silicon/nitrogen ratio of the PECVD (plasma-enhanced chemical-vapor deposition) chamber in which the silicon nitride is deposited on a silicon substrate. And FIG. 3 shows plots of CMP removal rate and wet etch rate, respectively, of silicon oxide vs silicon/oxygen ratio of the PECVD chamber in which the silicon oxide is deposited on a silicon substrate. By using such a composite silicon nitride layer and, optionally, a composite TEOS layer, many advantages can be obtained from the present invention. These include:

(1) Allowing the PECVD conditions to be flexibly adjusted such that the multi-layered CMP stopper includes an ultra-low CMP removal rate PECVD nitride stopper which prevents damages to the active areas of the silicon substrate during the CMP process.

(2) Allowing the PECVD conditions to be flexibly adjusted such that the multi-layered CMP stopper includes a high CMP removal rate PECVD nitride layer comparable to the sacrificial TEOS layer so as to minimize the dishing effect at wide trench area, as a result of relatively small difference in the removal rates between the oxide and the nitride stopper at or near the end of polishing. In other words, the present invention allows one of the nitride layers to serve as a co-sacrificial layer with relatively high CMP removal rate comparable to that of sacrificial oxide, while allowing an ultra-low nitride stopper to be provided for maximum protection of the underlying silicon substrate.

(3) Minimizing oxide residue above the nitride stopper at the over-polishing stage as a result of the presence of the relatively high CMP removal rate nitride layer.

(4) The multi-layered sacrificial oxide allows ultra-high CMP removal rate to be achieved to enhance CMP and CVD throughput.

(5) At the same time, multi-layered sacrificial oxide also includes a low CMP removal rate oxide to minimize the dishing effect at wide trench area, as a result of the substantially reduced difference in the removal rates between the nitride stopper and the sacrificial oxide.

(6) But one of the most important advantages of the method of the present invention is that the properties of both the composite nitride and the composite oxide can be conveniently adjusted to change the stoichiometry (between silicon and nitrogen or oxygen atoms) to provide the optimum operating condition and achieve the best results, without incurring introducing any major process complexity.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A series of silicon nitride layers were prepared by adjusting the gas flow ratio in a PECVD chamber between a silicon-containing component $SiH_4$ and a nitrogen-containing component $N_2$ gas. These silicon nitride layers with varying stoichiometry due to the different chemical vapor composition are tested for their tensile stress, density, etch rate (in a $NH_4F$ buffered HF wet chemical etch), CMP removal rate, etc. The results are summarized in Table 1.

TABLE 1

| Silicon Nitride Samples | SiN-1 | SiN-2 | SiN-3 | SiN-4 | SiN-5 |
|---|---|---|---|---|---|
| Relative Silicon/Nitrogen Ratio in the gas flow (5 being the highest, and 1 the lowest) | 1 | 2 | 3 | 4 | 5 |
| Tensile Strength (Gdyne/cm$^2$) | 4.90 | 0.64 | −2.90 | −9.40 | −9.80 |
| Density (g/cm$^3$) | 1.94 | 2.45 | 2.52 | 2.73 | 3.04 |
| Etch Rate (nm/min) | 400.4 | 239.4 | 232.8 | 230.4 | 188.4 |
| CMP Removal Rate (nm/min) | 211.9 | 65.8 | 119.7 | 99.7 | 80.0 |

As shown in Table 1, when the silicon/nitrogen ratio was increased in the PECVD process, the etch rate and the CMP removal rate of the resultant silicon nitride layer decreased.

EXAMPLE 2

A series of TEOS layers were also prepared by adjusting the gas flow ratio in a PECVD chamber between a silicon-containing component SiH$_4$ and an oxygen-containing component O$_2$ gas. These silicon oxide layers with varying stoichiometry due to the different chemical vapor composition are tested for their tensile stress, density, etch rate (in a NH$_4$F buffered HF wet chemical etch), and CMP removal rate. The results are summarized in Table 2.

TABLE 2

| TEOS Samples | TEOS-1 | TEOS-2 | TEOS-3 | TEOS4 | TEOS-5 |
|---|---|---|---|---|---|
| Relative Silicon/Oxygen Ratio in the gas flow (5 being the highest, and 1 the lowest) | 1 | 2 | 3 | 4 | 5 |
| Strength (Gdyne/cm$^2$) | −0.44 | 0.38 | 2.05 | 3.30 | 3.86 |
| Density (g/cm$^3$) | 2.16 | 2.23 | 2.26 | 2.27 | 2.27 |
| Etch Rate (mn/min) | 898.9 | 433.9 | 332.1 | 301.1 | 273.3 |
| CMP Removal Rate (nm/min) | 333.1 | 261.7 | 245.6 | 218.7 | 185.6 |

As it is also shown in Table 2, when the silicon/oxygen ratio was increased in the PECVD process, the etch rate and the CMP removal rate of the resultant TEOS layer also decreased.

EXAMPLE 3

A shallow trench was formed according to the procedure described above which contained a composite silicon nitride with a plurality of silicon nitride layers and a composite TEOS with a plurality of TEOS layers. After CMP planarization, the semiconductor device was examined under SEM. The SEM photographs showed excellent stopping efficiency, and the absence of remaining oxide on the nitride stopper.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a shallow trench isolation structure in a silicon substrate, comprising the steps of:
    (a) forming a composite silicon nitride layer on a silicon substrate on top of at least two spaced apart active regions of said silicon substrate;
    (b) forming a shallow trench between said active regions;
    (c) depositing a sacrificial oxide filler layer inside said shallow trench and on top of said composite silicon nitride layer; and
    (d) using a chemical-mechanical polishing (CMP) process to planarize said sacrificial oxide filler layer;
    (e) wherein said composite silicon nitride layer comprises at least two silicon nitride layers which are deposited in such a manner that their respective CMP removal rate increases with increased distance from the silicon substrate.

2. The method for forming a shallow trench isolation structure in a silicon substrate according to claim 1, wherein said composite silicon nitride layer is formed using a process comprising the following steps:
    (a-1) using a plasma-enhanced chemical-vaporization deposition (PECVD) process to deposit a first silicon nitride on to the silicon substrate in a PECVD chamber, which contains a silicon containing component and a nitrogen containing component at the a first silicon/nitrogen ratio;
    (a-2) reducing said silicon/nitrogen ratio in said PECVD chamber and depositing another layer of silicon nitride at the reduced silicon/nitrogen ratio; and
    (a-3) repeating step (a-2), if so desired, to deposit one or more silicon nitride layers at further reduced silicon/nitrogen ratios.

3. The method for forming a shallow trench isolation structure in a silicon substrate according to claim 2, wherein said silicon-containing component is SiH$_4$ or a tetra-ethyl-ortho-silicate (TEOS) and said nitrogen-containing component is NH$_3$ or N$_2$.

4. The method for forming a shallow trench isolation structure in a silicon substrate according to claim 1, wherein said composite silicon nitride layer is formed using a photoresist.

5. The method for forming a shallow trench isolation structure in a silicon substrate according to claim 1, wherein said shallow trench is formed using an etching process using said composite silicon nitride layer as an etch mask.

6. The method for forming a shallow trench isolation structure in a silicon substrate according to claim 1 which further comprises the step of forming a pad oxide layer on top of the silicon substrate by thermal oxidation prior to the formation of said composite silicon nitride layer.

7. The method for forming a shallow trench isolation structure in a silicon substrate according to claim 1 which further comprises the step of forming a thin oxide liner on a surface of said shallow trench prior to the formation of said sacrificial oxide filler layer.

8. The method for forming a shallow trench isolation structure in a silicon substrate according to claim 1 which further comprises the step of forming a composite silicon oxide layer on top of said sacrificial oxide filler layer.

9. The method for forming a shallow trench isolation structure in a silicon substrate according to claim 8 wherein said composite silicon oxide layer comprises at least two silicon oxide layers which are deposited in such a manner that their respective CMP removal rate increases with increased distance from said silicon substrate.

10. The method for forming a shallow trench isolation structure in a silicon substrate according to claim 9 wherein said composite silicon oxide layer is formed using a process which comprises the following steps:

(f-1) using a plasma-enhanced chemical-vaporization deposition (PECVD) process to deposit a first silicon oxide layer on to said sacrificial oxide filler layer in a PECVD chamber, which contains a silicon containing component and an oxygen containing component at the a first silicon/oxygen ratio;

(f-2) reducing said silicon/oxygen ratio in said PECVD chamber and depositing another layer of silicon oxide at the reduced silicon/nitrogen ratio; and (f-3) repeating step (f-2), if so desired, to deposit one or more silicon oxide layers at further reduced silicon/nitrogen ratios.

11. The method for forming a shallow trench isolation structure in a silicon substrate according to claim 10, wherein said silicon-containing component is $SiH_4$ or tetra-ethyl-ortho-silicate (TEOS) and said oxygen-containing component is $N_2O$ or $O_2$.

12. The method for forming a shallow trench isolation structure in a silicon substrate according to claim 10, wherein said composite silicon nitride layer and said composite silicon oxide layer are so formed such that the CMP removal rate of at least one of said nitride layers in said composite silicon nitride layer is no greater than 20% lower than at least one of said silicon oxide layer in said composite silicon oxide layer.

* * * * *